United States Patent
Choi et al.

(10) Patent No.: US 9,502,689 B2
(45) Date of Patent: Nov. 22, 2016

(54) ORGANIC LIGHT EMITTING DISPLAY AND METHOD OF MANUFACTURING THE SAME

(71) Applicants: Jong-Hyun Choi, Yongin (KR); Jae-Hwan Oh, Yongin (KR); Byoung-Ki Kim, Yongin (KR)

(72) Inventors: Jong-Hyun Choi, Yongin (KR); Jae-Hwan Oh, Yongin (KR); Byoung-Ki Kim, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 387 days.

(21) Appl. No.: 13/651,587

(22) Filed: Oct. 15, 2012

(65) Prior Publication Data

US 2013/0301278 A1  Nov. 14, 2013

(30) Foreign Application Priority Data

May 8, 2012  (KR) .................. 10-2012-0048830

(51) Int. Cl.
*H01L 51/40* (2006.01)
*H01L 51/52* (2006.01)
*H01L 27/32* (2006.01)

(52) U.S. Cl.
CPC ....... *H01L 51/5265* (2013.01); *H01L 27/3211* (2013.01); *H01L 27/3258* (2013.01)

(58) Field of Classification Search
USPC ......................................................... 257/40
See application file for complete search history.

(56) References Cited

U.S. PATENT DOCUMENTS

| | | | |
|---|---|---|---|
| 2010/0052524 A1* | 3/2010 | Kinoshita | 313/504 |
| 2010/0193790 A1* | 8/2010 | Yeo et al. | 257/59 |
| 2011/0089816 A1* | 4/2011 | Yokoyama et al. | 313/502 |
| 2011/0101346 A1* | 5/2011 | Tateishi | H01L 27/12 257/43 |
| 2012/0097967 A1* | 4/2012 | Choi et al. | 257/72 |
| 2013/0234149 A1* | 9/2013 | Halderman | H01L 33/32 257/76 |

FOREIGN PATENT DOCUMENTS

| | | | |
|---|---|---|---|
| KR | 1997-0022425 | | 5/1997 |
| KR | 10-2007-0070705 A | | 7/2007 |
| KR | 10-2008-0049443 A | | 6/2008 |
| WO | WO2011/106306 | * | 9/2011 |

* cited by examiner

*Primary Examiner* — Ali Naraghi
(74) *Attorney, Agent, or Firm* — Lee & Morse, P.C.

(57) ABSTRACT

An organic light emitting display device includes a sub-pixel having a first electrode and a second electrode arranged on a substrate, the first and second electrodes face each other, a light emission layer interposed between the first and second electrodes, and a mirror unit that corresponds to a portion of the light emission layer. The mirror unit is buried in a first part of a base surface of the sub-pixel such that a side of the mirror unit facing the light emission layer is aligned with a side of a second part of the base surface that faces the light emission layer and that excludes the mirror unit.

12 Claims, 4 Drawing Sheets

ORGANIC LIGHT EMITTING DISPLAY AND METHOD OF MANUFACTURING THE SAME

CROSS-REFERENCE TO RELATED PATENT APPLICATION

This application claims priority under 35 U.S.C. §119 to Korean Patent Application No. 10-2012-0048830, filed on May 8, 2012, in the Korean Intellectual Property Office, the disclosure of which is incorporated herein in its entirety by reference.

BACKGROUND

An organic light emitting display device realizes colors based on the principle in which holes and electrons respectively emitted from an anode and a cathode recombine in a light emission layer. Pixels in the organic light emitting display device may include a stacked structure in which the light emission layer is inserted between a pixel electrode, e.g., the anode, and an opposite electrode, e.g., the cathode.

SUMMARY

Embodiments may be realized by providing an organic light emitting display device that includes a sub-pixel having a first electrode and a second electrode that are formed on a substrate and face each other, a light emission layer interposed between the first and second electrodes and a mirror unit that is formed to correspond to a portion of the light emission layer, wherein the mirror unit is buried into a base surface of the sub-pixel so that the mirror unit does not protrude toward the light emission layer compared to an area where the mirror unit is not formed.

An image may be formed toward the first electrode, and the mirror unit may be formed close to the first electrode, wherein the first electrode is formed of a transparent material, and the mirror unit is formed of a semi-transparent material which allows light to be reflected toward the second electrode in a partial area of the first electrode.

The base surface may be a buffer layer formed on the substrate. The transparent material may include one of indium tin oxide (ITO) and indium zinc oxide (IZO). The semi-transparent material may include one of a metal and a distributed Bragg reflector (DBR) material. The metal may include one of Ag, Al, Mg, Cu, MgAg, and CaAg. The DBR material may include one of $SiO_2$, $SiN_x$, ITO, $ZnO_2$, and $ZrO_2$.

Embodiments may also be realized by providing an organic light emitting display device that includes a buffer layer formed on a substrate, wherein a mirror unit is formed on a portion of the buffer layer; a thin film transistor (TFT) that includes an active layer, a gate electrode, a source electrode, and a drain electrode; a capacitor including a bottom electrode formed in a same layer as the active layer and a top electrode formed to face the bottom electrode; a first insulating layer that is disposed between the bottom electrode and the top electrode and between the active electrode and the gate electrode; a second insulating layer formed on the first insulating layer; a pixel electrode formed of a same material as the top electrode; a third insulating layer that covers the source electrode and the drain electrode and exposes the pixel electrode; an organic light emission layer disposed on the pixel electrode; and an opposite electrode disposed on the organic light emission layer.

The organic light emitting display device may further comprise a pad portion formed in a same layer as the source electrode and the drain electrode.

Embodiments may also be realized by providing a method of manufacturing an organic light emitting display device that includes burying a mirror unit in a base surface on a substrate; forming a first electrode including both a portion corresponding to the mirror unit and a portion not facing the mirror unit; forming a light emission layer on the first electrode; and forming a second electrode on the light emission layer.

The burying of the mirror unit may include forming a buffer layer on the substrate, wherein the buffer layer is formed to the base surface; forming a silicon layer on the buffer layer; patterning using a halftone mask so that there is a portion where the silicon layer remains, a portion from which the silicon layer is removed so that the buffer layer is exposed, and a portion where the buffer layer is removed up to a predetermined depth so as to form a filling groove; and forming the mirror unit in the filling groove. The portion where the silicon layer remains may be formed to an active layer of a TFT, which is to be connected to the first electrode.

BRIEF DESCRIPTION OF THE DRAWINGS

Features will become apparent by describing in detail exemplary embodiments thereof with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Figure 1:
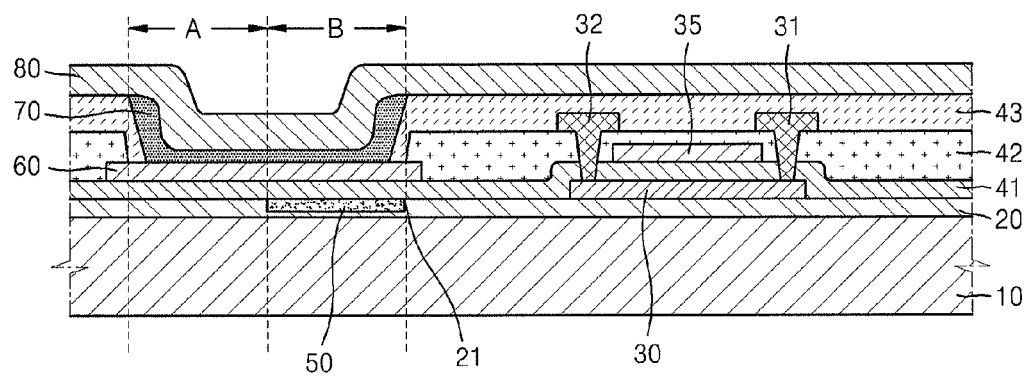
FIG. 1 illustrate a cross-sectional view of a sub-pixel and a thin film transistor (TFT) of an organic light emitting display device according to an exemplary embodiment.

FIG. 1 is a cross-sectional view illustrating a sub-pixel which forms a unit pixel of an organic light emitting display device and a thin film transistor (TFT) connected to the sub-pixel, according to an exemplary embodiment. The unit pixel includes three-color sub-pixels of a red sub-pixel R, a green sub-pixel G, and a blue sub-pixel B, and FIG. 1 illustrates one of the sub-pixels, and other sub-pixels may also be formed of the same structure. Also, in the organic light emitting display device, unit pixels including these three-color sub-pixels are repeatedly arranged in row and column directions.

Referring to FIG. 1, first, a buffer layer 20 is formed on a substrate 10 formed of a transparent glass or a plastic material, and a mirror unit 50 formed of a semi-transparent material is buried in a filling groove 21 formed in the buffer layer 20. An uppermost surface of the mirror unit 50 may be aligned with an uppermost surface of a first region of the buffer layer 20, and the first region of the buffer layer 20 is a region where the filling groove 21 is not formed. Accordingly, the mirror unit 50 may be buried in the buffer layer 20 so that top surfaces of the mirror unit 50 and the buffer layer 20 are horizontally aligned, coplanar, and/or even with respect to each other so as to form one flat surface between regions of the buffer layer 20 where the mirror unit 50 is formed and regions of the buffer layer 20 where the mirror unit 50 is not formed.

The mirror unit 50 is formed in a position corresponding to an area B from among all light emission areas (A+B) of a sub-pixel, e.g., the mirror unit 50 is formed under only a half of ones of the light emission areas, and resonance is generated in a portion of the sub-pixel where the mirror unit 50 is formed. That is, the area B where the mirror unit 50 is formed is a resonance area, and the area A where the mirror unit 50 is not included is a non-resonance area. For example, each of the light emission areas may be divided, e.g., into half, to include the resonance area and the non-resonance area so that the resonance area is discontinuously formed within the sub-pixel in a predetermined pattern.

A pixel electrode (hereinafter referred to as a first electrode) 60 that covers both the resonance area A and the non-resonance area B is formed above the mirror unit 50, and an organic light emission layer 70 and an opposite electrode (hereinafter referred to as a second electrode) 80 are sequentially stacked on the first electrode 60. Accordingly, when light is emitted from the organic light emitting layer 70 due to a voltage generated between the first and second electrodes 60 and 80, the light is emitted toward the first electrode 60, and the light is emitted to the outside from the resonance area B and the non-resonance area A according to different mechanisms.

That is, since resonance is not generated in the non-resonance area A, light generated from the organic light emitting layer 70 passes through the first electrode 60 and the substrate 10 to be immediately emitted to the outside.

However, as the mirror unit 50 formed of a semi-transparent material is included below the first electrode 60 in the resonance area B, light generated from the organic light emitting layer 70 moves reciprocally between the mirror unit 50 and the second electrode 80, which is a total reflection electrode, thereby generating a micro cavity. Here, the light causes constructive interference to occur thereby increasing light intensity. Since conditions for reflection intervals where constructive interference easily occurs vary according to light of each of R, G, and B colors, the mirror unit 50 and the second electrode 80 may be adjusted at intervals according to the conditions. For example, a reflection interval at which constructive interference is possible is in proportion to a light wavelength, and thus, when this interval is suitably set according to each color, the intensified light may be implemented. In addition, the light intensified through this micro cavity passes the first electrode 60 to be emitted to the outside.

As a result, light that is immediately emitted from the non-resonance area A and light that is emitted from the resonance area B after being intensified are mixed and then emitted from a sub-pixel, and as the effect of non-resonance light emission and the effect of resonance light emission are mixed, both light extraction efficiency and viewing angle characteristics may be improved.

That is, light emitted from the resonance area B is intensified through resonance, and thus the intensity and collimation of light are increased. Thus, while the light extraction efficiency is creased, the collimation of the light is increased, and when a viewing angle deviates from the very center of a screen even slightly, luminance or color coordinates of light may vary greatly. On the other hand, as light is emitted from the non-resonance area A without resonance, light extraction efficiency is not increased but the viewing angle characteristics are improved compared to the resonance area B. Accordingly, compared to a sub-pixel including only the non-resonance area A, light extraction efficiency may be increased, and compared to a sub-pixel including only the resonance area B, the effect of reducing the possibility of the viewing angle characteristics from being deteriorated too much may be obtained.

In addition, as the mirror unit 50 is not protruded toward the organic light emitting layer 70, but is buried in the filling groove 21 of the buffer layer 20 (which is a base surface), the characteristics of a resonance structure and a non-resonance structure as described above are both included, and the risk of generating of dark points may be reduced. That is, if the mirror unit 50 is protruded from the buffer layer 20, the first and second electrodes 60 and 80 and the organic light emitting layer 70 which are also formed on the buffer layer 20 are to be stacked thereon while forming a step according to the protruded form. In this case, the layers may not be properly stacked on the step and the first and second electrodes 60 and 80 may directly contact each other, and this is highly likely to cause a short circuit.

In contrast, according to an exemplary embodiment, when the mirror unit 50 is buried inside the filling groove 21 of the buffer layer 20, as there may not be any portion of the mirror unit 50 that protrudes upwardly. For example, there is no step formed in the first and second electrodes 60 and 80. Accordingly, the risk of causing a short circuit due to the step may reduced and/or prevented. Further, light extraction efficiency and viewing angle characteristics may be improved and the risk of a short circuit (or dark spots) occurring may be reduced.

Referring to FIG. 1, an active layer 30 of the TFT is illustrated, and a gate electrode 35, a source electrode 31, and a drain electrode 32 are shown. Also, first, second, and third insulating layers 41, 42, and 43 are included. While not shown in the cross-sectional view of FIG. 1, the drain electrode 32 is connected to the first electrode 60.

FIGS. 2A through 2D are cross-sectional views illustrating a method of manufacturing the sub-pixel and the TFT illustrated in FIG. 1. The organic light emitting display device having the above-described structure may be manufactured according to the method illustrated in FIGS. 2A through 2D.

Figure 2A:
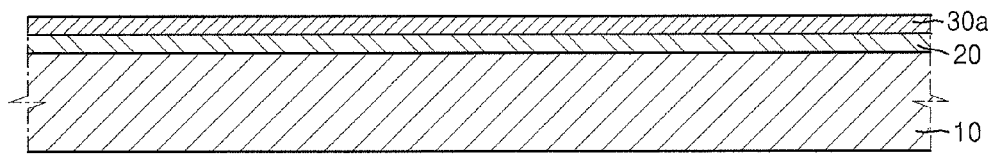
FIGS. 2A through 2D illustrate cross-sectional views depicting stages in a method of manufacturing the sub-pixel and the TFT illustrated in FIG. 1.

First, as illustrated in FIG. 2A, a buffer layer 20 is formed on a transparent substrate 10, and a silicon layer 30a is formed on the buffer layer 20.

Figure 2B:
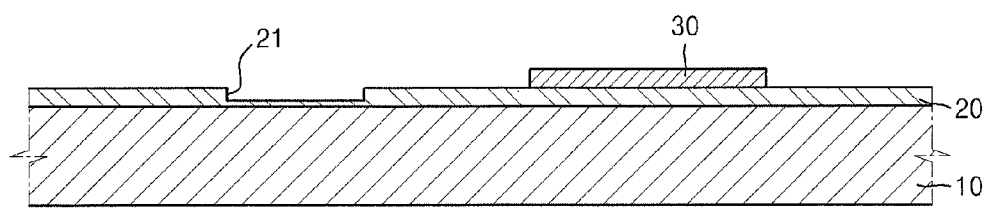

Next, as illustrated in FIG. 2B, a halftone mask (not shown) is used to pattern the substrate 10 into a portion where the silicon layer 30a remains, a portion from which the silicon layer 30a is removed such that the buffer layer 20 is exposed, and a portion where a filling groove 21 is formed as the buffer layer 20 is removed to a predetermined depth. The portion where the silicon layer 30a remains is the active layer 30 of the TFT.

Figure 2C:
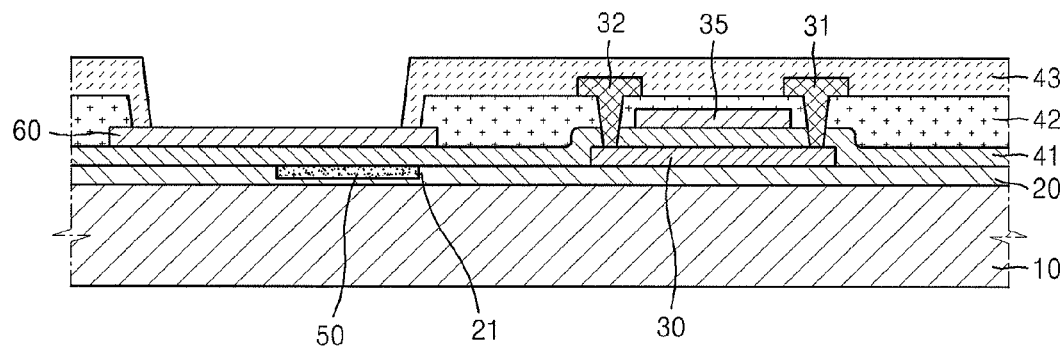

In addition, as illustrated in FIG. 2C, the mirror unit 50 formed of a semi-transparent material is filled in the filling groove 21. Here, a deposition operation using a mask may be used. The portion in the sub-pixel where the mirror unit 50 is included is the resonance area B, and the portion where the mirror unit 50 is not included is the non-resonance area A. Furthermore, the first electrode 60, the gate electrode 35, the source electrode 31, and the drain electrode 32 are stacked. Here, the first electrode 60 and the gate electrode 35 may each have a multi-layer structure in which a metal layer is stacked on an ITO layer; in particular, in the first electrode 60, a metal layer of a portion where the organic light emitting layer 70 is to be formed may be removed.

Figure 2D:
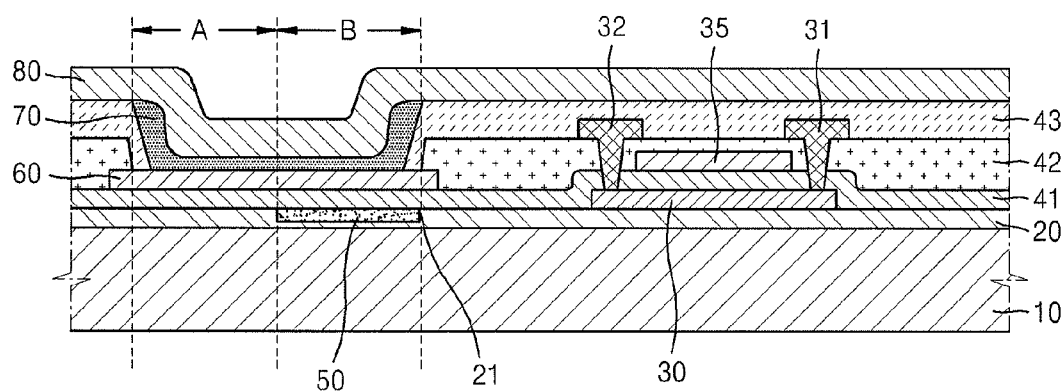

Then, as illustrated in FIG. 2D, when the organic light emitting layer 70 and the second electrode 80 are sequentially formed on the first electrode 60, an organic light emitting display device both including the resonance area B and the non-resonance area A is manufactured.

Accordingly, by using the organic light emitting display device including the sub-pixel according to the current exemplary embodiment, both light extraction efficiency and viewing angle characteristics thereof may be improved, and as the mirror unit 50 installed to improve light extraction efficiency is buried in a base surface, the risk of a short circuit occurring due to formation of a step may be greatly reduced.

According to an exemplary embodiment, the resonance area B and the non-resonance area A may have almost the same sizes, but according to circumstances, the two areas may also be formed to be asymmetric in order to further increase one of the two effects. That is, when light extraction efficiency is to be further maximized, the resonance area B may be formed to be larger than the non-resonance area A. However, even when the resonance area B is formed to be larger than the non-resonance area A, the non-resonance area A is still included in a small area, and thus the viewing angle characteristics may be improved compared to a sub-pixel which is formed of only the resonance area B.

In addition, while a bottom emission type organic light emitting display device, in which an image is formed toward the first electrode 60, is described in the above embodiment, the above-described structure may also be applied to a two-sided light emission type organic light emitting display device in which an image is also formed toward the second electrode 80. For example, the second electrode 80 may be formed to be thin and to thereby have semi-transmissive characteristics. Thus, the organic light emitting display device is not limited to a predetermined light emission type.

Figure 3A:
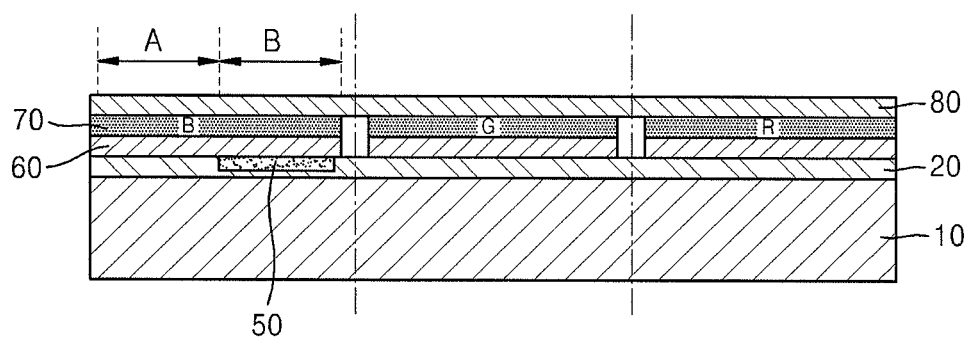
FIG. 3A illustrates a schematic view of the sub-pixel of FIG. 1 formed only in one of R, G, and B sub-pixels.
Figure 3B:
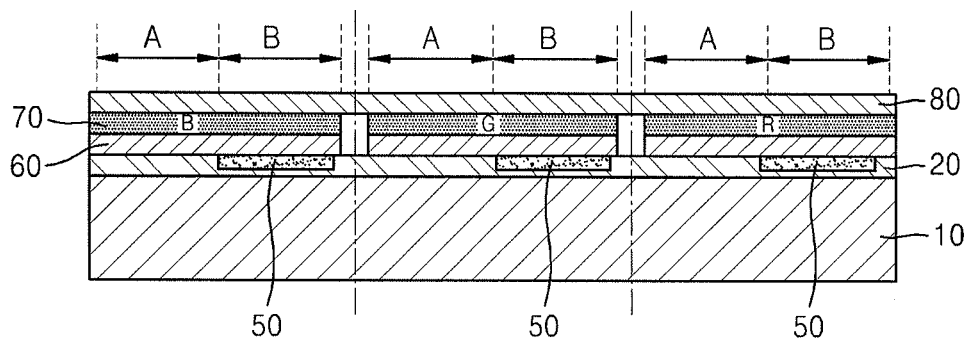
FIG. 3B illustrates a schematic view of the sub-pixel of FIG. 1 applied to all of R, G, and B sub-pixels.

FIG. 3A is a schematic view illustrating the sub-pixel of FIG. 1 formed only in one of R, G, and B sub-pixels. FIG. 3B is a schematic view illustrating the sub-pixel of FIG. 1 applied to all of R, G, and B sub-pixels.

In addition, according to necessity, the structure of the sub-pixel may be applied to all of R, G, and B sub-pixels or only to one color sub-pixel. That is, as schematically illustrated in FIG. 3A, for example, the mirror unit 50 is installed in, for example, a B sub-pixel from among the R, G, and B sub-pixels to form the resonance area B and the non-resonance A, or as illustrated in FIG. 3B, the mirror unit 50 may be installed in all of the R, G, and B sub-pixels to form the resonance area B and the non-resonance area A. In other words, to improve light extraction efficiency and viewing angle characteristics of sub-pixels of all colors, the mirror unit 50 is installed in all of the R, G, and B sub-pixels as illustrated in FIG. 3B, and to improve light extraction efficiency and viewing angle characteristics of a sub-pixel of a predetermined color, the mirror unit 50 may be installed only in a corresponding sub-pixel as illustrated in FIG. 3A.

In addition, the first electrode 60, which is transparent, may be formed of a material such as ITO or IZO described above, and the mirror unit 50 which is semi-transparent may be formed of a metal such as Ag, Al, Mg, Cu, MgAg, or CaAg or a material of a distributed Bragg reflector (DBR) such as $SiO_2$, $SiN_x$, ITO, $ZnO_2$, or $ZrO_2$.

Figure 4:
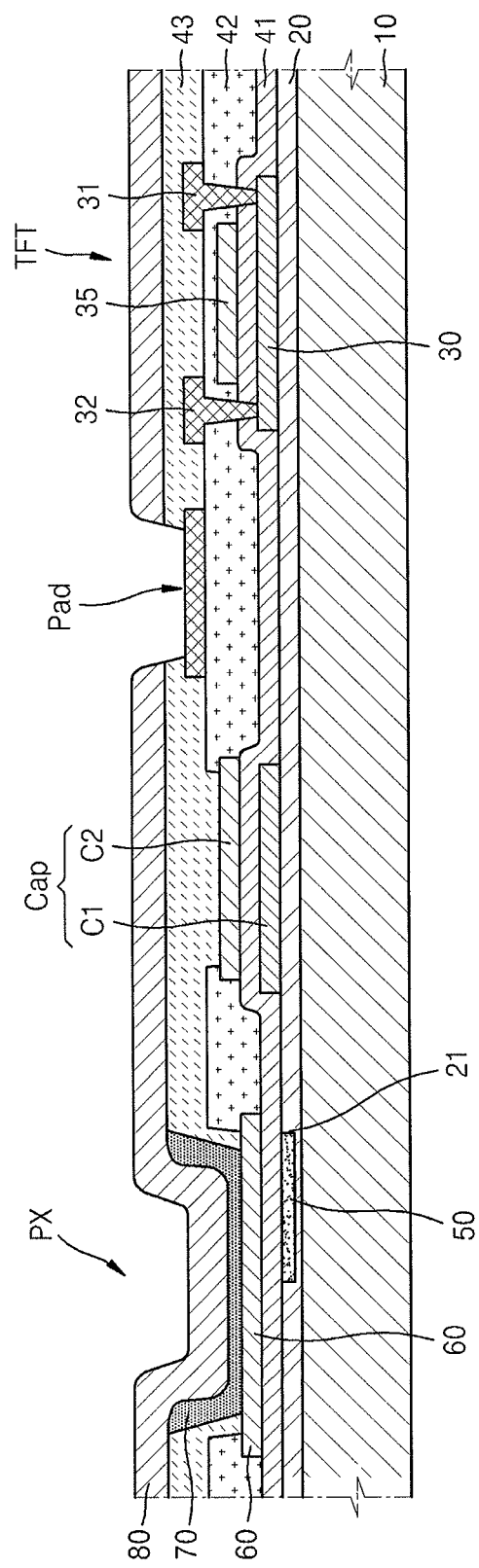
FIG. 4 illustrates a cross-sectional view of a capacitor and a pad portion that are formed together with the sub-pixel and the TFT of FIG. 1.

Meanwhile, while FIGS. 1 and 2D show only a cross-sectional view of a sub-pixel and a TFT for convenience in order to describe the resonance area B and the non-resonance area A, FIG. 4 illustrates a capacitor and a pad portion included in the organic light emitting display device.

That is, not only the sub-pixel PX and the thin film transistor TFT but also a capacitor Cap and a pad portion Pad, to which various wirings are connected, are also included in the organic light emitting display device. Here, the capacitor Cap includes a bottom electrode C1 and a top electrode C2 facing each other, and the bottom electrode C1 is formed of the same material and patterned in the same layer as the active layer 30, and the top electrode C2 is formed of the same material and patterned in the same layer as the pixel electrode 60.

The pad portion Pad may be formed of the same material and patterned in the same layer as the source electrode 31 and the drain electrode 32. That is, when the sub-pixel PX and the thin film transistor TFT are formed according to the method illustrated in FIGS. 2A through 2D, the capacitor Cap and the pad portion Pad are also patterned together.

That is, the organic light emitting display device according to the current exemplary embodiment includes not only the sub-pixel PX and the thin film transistor TFT but also the capacitor Cap and the pad portion Pad which are patterned together. Accordingly, in the organic light emitting display device both the light extraction efficiency and viewing angle characteristics may be improved, and probability of dark points (or short circuits) may also be reduced.

By way of summation and review, organic light emitting devices include unit pixels that are further divided into sub-pixels such as red pixels, green pixels, and blue pixels. Desired display colors may be represented by a combination of the three sub-pixels. For example, each sub-pixel includes a light emission layer emitting one of red, green, and blue colors, which is interposed between two electrodes, and an overall color of the unit pixel is represented by a suitable combination of these three-color lights of the sub-pixels.

In order to improve light extraction efficiency of an organic light emitting display device, more and more sub-pixels may be formed to have a resonance structure. That is, in the resonance structure, one of an anode and a cathode, at which an image is formed, is formed as a semi-transmissive electrode, and the opposite electrode is formed as a total reflection electrode, so that light may travel reciprocally therebetween to generate constructive interference. Accordingly, considerably intensified light may be extracted from each sub-pixel.

However, when applying the above-described resonance structure, while light extraction efficiency is increased, viewing angle characteristics may be deteriorated. That is, when using the resonance structure, collimation of light is improved, and this may further reduce luminance according to viewing angles and increase a color shift.

Accordingly, in order to provide both light extraction efficiency and improved viewing angle characteristics at the same time, a sub-pixel may include both a resonance structure and a non-resonance structure together therein. For example, a mirror unit may be formed only in a portion of the sub-pixel so that resonance is generated only in the portion where the mirror unit is included, and resonance is not generated in another portion where the mirror unit is not included. Accordingly, light extraction efficiency and viewing angle characteristics may be both increased.

However, when a mirror unit is formed in a portion of the sub-pixel, a protruded step may be formed corresponding to the mirror unit. As such, when an insulating layer and electrodes are stacked along this step, the insulating layer may be cut due to the bent form of the step, and this may increase the probability of a short circuit. That is, by depositing a thin film along the abruptly bent form such as the protruded step, deposition may not be accurately performed along the form of the step and/or the bent form may be easily cut, and this increases the probability of a short circuit. If a short circuit is generated, a corresponding sub-pixel becomes a dark point which is not able to emit light.

In contrast, embodiments relate to an organic light emitting display device and a method of manufacturing the same that may improve light extraction efficiency and viewing angle characteristics and that may also reduce generation of dark points (or short circuits within sub-pixels). For example, embodiments include an organic light emitting display device, in which a sub-pixel includes a resonance area where light generated from a light emission layer is resonated to be emitted, and a non-resonance area where light is emitted without being resonated, and a mirror unit installed to form the resonance area may be buried in a buffer layer without forming any step. Accordingly, both the light extraction efficiency and viewing angle characteristics of the organic light emitting display device may be improved, and a probability of dark points or short circuits may also be reduced.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display device, comprising:
   a sub-pixel including:
      a first electrode and a second electrode arranged on a substrate, the first and second electrodes facing each other,
      a light emission layer interposed between the first and second electrodes, and
      a mirror unit that corresponds to a portion of the light emission layer, the mirror unit being buried in a first part of a base surface of the sub-pixel such that an uppermost surface of the mirror unit facing the light emission layer is coplanar with an uppermost surface of a second part of the base surface that faces the light emission layer and that excludes the mirror unit,
   wherein the mirror unit only partially overlaps a bottommost surface of the light emission layer, light is reflected from the mirror unit to the second electrode, and light reflected from the mirror unit to the second electrode is reflected from the second electrode and passes the first electrode to be emitted to outside the substrate.

2. The organic light emitting display device of claim 1, wherein:
   an image is formed toward the first electrode, and
   the mirror unit is formed close to the first electrode, and
   the first electrode is formed of a transparent material, and
   the mirror unit is formed of a semi-transparent material that allows light to be reflected toward the second electrode in a partial area of the first electrode.

3. The organic light emitting display device of claim 2, wherein the base surface is a buffer layer on the substrate.

4. The organic light emitting display device of claim 2, wherein the transparent material includes one of indium tin oxide and indium zinc oxide.

5. The organic light emitting display device of claim 2, wherein the semi-transparent material includes one of a metal and a distributed Bragg reflector material.

6. The organic light emitting display device of claim 5, wherein the metal includes one of Ag, Al, Mg, Cu, MgAg, and CaAg.

7. The organic light emitting display device of claim 5, wherein the distributed Bragg reflector material includes one of $SiO_2$, $SiN_x$, ITO, $ZnO_2$, and $ZrO_2$.

8. An organic light emitting display device, comprising:
   a buffer layer on a substrate and a mirror unit on a portion of the buffer layer;
   a thin film transistor that includes an active layer, a gate electrode, a source electrode, and a drain electrode;
   a capacitor that includes a bottom electrode formed in a same layer as the active layer and a top electrode facing the bottom electrode;
   a first insulating layer arranged between the bottom electrode and the top electrode, and arranged between the active layer and the gate electrode;
   a second insulating layer on the first insulating layer;
   a pixel electrode formed of a same material as the top electrode;
   a third insulating layer that covers the source electrode and the drain electrode, the third insulating layer exposing the pixel electrode;
   an organic light emission layer on the pixel electrode, an uppermost surface of the mirror unit facing the organic light emission layer being coplanar with an uppermost surface of a part of the buffer layer that faces the organic light emission layer and that excludes the mirror unit; and
   an opposite electrode on the organic light emission layer,
   wherein the mirror unit only partially overlaps a bottommost surface of the organic light emission layer, light is reflected from the mirror unit to the opposite electrode, and light reflected from the mirror unit to the opposite electrode is reflected from the opposite electrode and passes the pixel electrode to be emitted to outside the substrate.

9. The organic light emitting display device of claim 8, further comprising a pad portion in a same layer as the source electrode and the drain electrode.

10. A method of manufacturing an organic light emitting display device, the method comprising:
    burying a mirror unit in a base surface on a substrate such that an uppermost surface of the mirror unit is coplanar with an uppermost surface of a part of the base surface that excludes the mirror unit;
    forming a first electrode including both a first portion corresponding to the mirror unit and a second portion in a non-facing arrangement with respect to the mirror unit;
    forming a light emission layer on the first electrode; and
    forming a second electrode on the light emission layer,
    wherein the mirror unit only partially overlaps a bottommost surface of the light emission layer, light is reflected from the mirror unit to the second electrode, and light reflected from the mirror unit to the second electrode is reflected from the second electrode and passes the first electrode to be emitted to outside the substrate.

11. The method of claim 10, wherein the burying of the mirror unit includes:

forming a buffer layer on the substrate, the buffer layer being formed to the base surface;

forming a silicon layer on the buffer layer;

patterning using a halftone mask so that there is a first region where the silicon layer remains, a second region from which the silicon layer is removed so that the buffer layer is exposed, and a third region where the buffer layer is removed to a predetermined depth to form a filling groove; and forming the mirror unit in the filling groove.

12. The method of claim 11, wherein:

the first region where the silicon layer remains is formed into an active layer of a thin film transistor, and first electrode is formed to be connected to the active layer.

* * * * *